(12) United States Patent
Do et al.

(10) Patent No.: US 8,389,330 B2
(45) Date of Patent: Mar. 5, 2013

(54) INTEGRATED CIRCUIT PACKAGE SYSTEM WITH PACKAGE STAND-OFF AND METHOD OF MANUFACTURE THEREOF

(75) Inventors: Byung Tai Do, Singapore (SG); Linda Pei Ee Chua, Singapore (SG); Reza Argenty Pagaila, Singapore (SG)

(73) Assignee: Stats Chippac Ltd., Singapore (SG)

( * ) Notice: Subject to any disclaimer, the term of this patent is extended or adjusted under 35 U.S.C. 154(b) by 43 days.

(21) Appl. No.: 12/822,659

(22) Filed: Jun. 24, 2010

(65) Prior Publication Data
US 2011/0316133 A1   Dec. 29, 2011

(51) Int. Cl.
*H01L 21/00* (2006.01)
*H01L 21/56* (2006.01)
*H01L 23/495* (2006.01)

(52) U.S. Cl. ........ 438/108; 438/109; 438/112; 438/124; 438/127; 257/676; 257/777; 257/E21.001; 257/E21.502; 257/E23.031

(58) Field of Classification Search .................. 257/777, 257/E21.001
See application file for complete search history.

(56) References Cited

U.S. PATENT DOCUMENTS

| | | | |
|---|---|---|---|
| 6,229,200 B1 | 5/2001 | Mclellan et al. | |
| 6,238,952 B1 | 5/2001 | Lin | |
| 6,498,099 B1 | 12/2002 | McLellan et al. | |
| 7,049,177 B1 | 5/2006 | Fan et al. | |
| 7,074,647 B2 * | 7/2006 | Owens et al. | 438/108 |
| 7,154,186 B2 * | 12/2006 | Noquil et al. | 257/778 |
| 7,247,934 B2 * | 7/2007 | Pu | 257/686 |
| 7,531,383 B2 * | 5/2009 | Lo et al. | 438/109 |
| 2007/0059863 A1 | 3/2007 | Li et al. | |
| 2007/0181983 A1 | 8/2007 | Takai et al. | |
| 2008/0032459 A1 * | 2/2008 | Lebonheur et al. | 438/127 |
| 2008/0067649 A1 | 3/2008 | Matsunaga et al. | |
| 2008/0203549 A1 * | 8/2008 | Chow et al. | 257/673 |
| 2009/0127683 A1 * | 5/2009 | Do et al. | 257/676 |
| 2009/0127720 A1 | 5/2009 | Do et al. | |

* cited by examiner

*Primary Examiner* — Angel Roman
(74) *Attorney, Agent, or Firm* — Ishimaru & Associates; Mikio Ishimaru

(57) ABSTRACT

A method of manufacture of an integrated circuit package system includes: providing a penetrable layer; partially immersing leads in the penetrable layer; coupling an integrated circuit die to the leads; molding a package body on the integrated circuit die, the leads, and the penetrable layer; and exposing stand-off leads from the leads by removing the penetrable layer including establishing a stand-off height between a bottom of the package body and the bottom of the stand-off leads.

20 Claims, 7 Drawing Sheets

INTEGRATED CIRCUIT PACKAGE SYSTEM WITH PACKAGE STAND-OFF AND METHOD OF MANUFACTURE THEREOF

TECHNICAL FIELD

The present invention relates generally to an integrated circuit package system, and more particularly to a system for improving manufacturing yield of assemblies using the integrated circuit package system.

BACKGROUND ART

The attachment of components to printed circuit boards (PCBs) produces printed circuit board assemblies (PCBAs), which can be used for motherboards in computers systems, peripheral devices, hand held personal electronic devices, or any electronic device that supports an integrated circuit. A PCB may be a laminated board made of an insulating material such as plastic which contains several layers of metal such as copper separated by insulating material or it may be made of a flexible Mylar backing having plated copper or aluminum traces and interconnects. The metal may function to establish electrical connections between parts mounted on the board, conduct heat, or provide a shield or reference voltage.

One increasingly popular component of PCBAs is a quad flat pack no-lead (QFN) chip. QFNs. A QFN is an electronic component encapsulated in plastic, ceramic, or some other insulating material. A QFN contains rows of IO pads, areas in which bare metal is exposed, on each of its four sides (hence, the "quad" in QFN) for electrical connectivity with the PCB. The QFN also typically contains a thermal pad underneath, an exposed area of metal for conducting heat away from the package.

A QFN may be light, present a small footprint, and feature good thermal and electrical conductivity. The small footprint conserves space on the PCB, which can be scarce due to the industry trend to miniaturize products and add additional functions.

Good thermal conductivity helps to maintain the QFN and the point of connection at an acceptable temperature, thus preserving the useful life and reliability of the chip. A QFN can be attached to a PCB by soldering it directly to a PCB. Due to the small size of the package and the close proximity of the I/O pads, precise positioning and proper solder techniques are required for volume assembly.

QFNs may prove more difficult to attach to PCBs than components with leads, which may be attached to a PCB by soldering the lead to the PCB. Soldering together two flat planes, the QFN thermal pad and the PCB, may be more difficult than soldering a lead from a leaded component to the PCB.

To solder the QFN to the PCB, solder paste, which may contain solder and flux chemicals, can be applied to the surface of the PCB at appropriate regions. The solder paste can be applied to the PCB surface by extrusion through a stencil. The solder paste can be placed on the stencil and forced through the apertures of the stencil by pressing with a squeegee.

After the application of solder paste, the QFN can be positioned on the PCB, and the assembly placed into an oven or series of ovens and heated. The heating can evaporate the flux chemicals and other solvents and cause the solder to melt, leading to wetting and wicking. A solder mask can also be placed on the PCB to control the solder paste during heating. The solder mask defines openings on the outer layers of the PCB and exposes the copper features of the PCB. The solder mask helps to prevent the liquid solder from flowing away from the desired areas of solder application. As the number of I/O pads increases and the package size is decreased, the risk of solder flowing between multiple I/O pads increases.

The solder mask is placed over the PCB, and solder paste is applied to areas of the PCB to which the QFN is to be attached that are not protected with a solder mask. Due to the small spaces between the I/O pads and the flat surfaces in close proximity, a capillary effect may cause the solder to flow across the solder mask to inadvertently couple the I/O pads. This difficulty is not evident by inspection because the connections may be under the package itself.

To prepare for attachment of a QFN, the area of the PCB on which the QFN will rest may be fitted with I/O pads and a thermal pad, regions for contact with the QFN I/O pads and QFN thermal pad. The pads may consist of copper or another metal. When the QFN is attached to the PCB, the QFN pads rest on the corresponding PCB pads and are connected with solder.

The PCB pads may be slightly larger than the QFN pads to provide tolerance for imperfect placement. The QFN I/O pads may be soldered to the PCB I/O pads to provide an electrical connection between the PCB and the QFN. The thermal pad of the QFN may be soldered to the PCB thermal pad to provide thermal conductivity and a mechanical connection and can also provide an electrical connection.

The direct soldering of bare metal areas of the QFN to the surface of the PCB may provide for good electrical and thermal conductivity as well as a good mechanical connection. To conduct away heat transferred from the QFN thermal pad to the PCB thermal pad, the PCB thermal pad region may contain vias.

Generally, solder does not cover the entire PCB thermal pad. Instead, smaller regions of solder, called solder pads, can be deposited on the PCB thermal pad. The amount of coverage may be expressed as a percentage. For example, 50% coverage indicates that half the area of the thermal pad is covered with solder.

The amount of solder placed on the PCB thermal pad is critical to the attachment process. When too much solder is placed on the PCB thermal pad, the QFN may actually float on top of the solder. The heating process may create a ball of solder in the middle of the QFN on which the QFN floats.

The QFN may begin to turn, depending on how the QFN was placed on the PCB and on other factors such as air movement and vibration. The movement of the QFN may create shorts in the QFN I/O pads. Movement of the QFN I/O pads may cause solder to smear from one QFN I/O pad to another. Since modern QFN packages may have multiple rows of I/O pads that are flush with the bottom of the package, the effects of solder smearing and the capillary effect can dramatically reduce the manufacturing yield.

Further, the floating of the QFN on the excess solder in the thermal pad region can interfere with the forming of solder joints in the IO pad regions. On the other hand, too little solder can cause a poor or non-existent connection between the QFN and the PCB.

In addition to the total amount of solder, the size of the individual solder pads affects the attachment process. A solder pad with minimum diameter smaller than the width of a stencil through which the solder pad is extruded may not deposit out of the stencil in the proper shape.

Thus, a need still remains for an integrated circuit package system with package stand-off, that allows a finished assembly yield improvement. In view of the constant demand for low cost electronic assemblies that provide additional functions in restricted space, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit package system including: providing a penetrable layer; partially immersing leads in the penetrable layer; coupling an integrated circuit die to the leads; molding a package body on the integrated circuit die, the leads, and the penetrable layer; and exposing stand-off leads from the leads by removing the penetrable layer including establishing a stand-off height between a bottom of the package body and the bottom of the stand-off leads.

The present invention provides an integrated circuit package system, including: stand-off leads positioned along an edge; an integrated circuit die coupled to the stand-off leads; and a package body molded on the integrated circuit die and the stand-off leads includes a bottom of the package body formed a stand-off height above the bottom of the stand-off leads and the bottom characterized by having been molded on a penetrable layer.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

Figure 1:
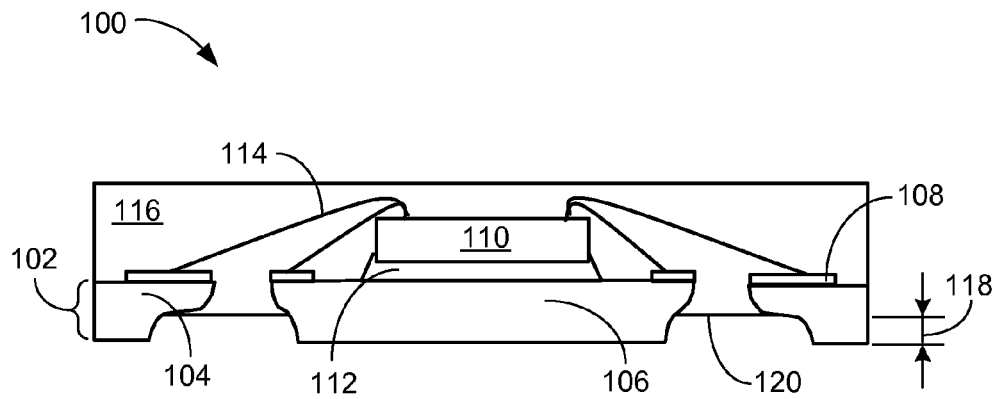
FIG. 1 is a cross-sectional view of an integrated circuit package system with manufacturing aid in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit die, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact between the elements with no intervening elements.

The term "processing" as used herein includes deposition of material or photoresist, patterning, exposure, development, etching, cleaning, and/or removal of the material or photoresist as required in forming a described structure.

Referring now to FIG. 1, therein is shown a cross-sectional view of an integrated circuit package system 100 with manufacturing aid in a first embodiment of the present invention. The cross-sectional view of the integrated circuit package system 100 depicts a lead frame 102, such as a copper (Cu) Quad Flatpack No-lead (QFN) lead frame, having stand-off leads 104 and a stand-off die attach pad 106.

A plated pad 108, such as a silver pad, or a PPF (Pre-Plated Finish) pad formed by a combination of nickel (Ni), palladium (Pd), and gold (Au), may be selectively plated on the lead frame 102. The plated pad 108 may provide a compatible coupling region on the surface of the lead frame 102.

An integrated circuit die 110 may be mounted on the stand-off die attach pad 106 by an adhesive 112, such as a die attach adhesive. Electrical interconnects 114 may couple the integrated circuit die 110 to the stand-off leads 104, the stand-off die attach pad 106, or a combination thereof.

A package body 116, such as an epoxy molding compound, may be formed on the integrated circuit die 110, the electrical interconnects 114, the plated pad 108, the stand-off leads 104, and the stand-off die attach pad 106. The package body 116 is formed in a way that provides a stand-off height 118 from the bottom of the stand-off lead 104 and the stand-off die attach pad 106 to a bottom 120 of the package body 116.

It is understood that the forming of the package body 116 to provide the stand-off height 118 may eliminate the spread of solder due to the capillary effect. It is also understood that the stand-off height 118 provides additional solder wettable surface on the stand-off leads 104 and the stand-off die attach pad 106. The additional solder wettable surface attracts the solder to the stand-off leads 104 and the stand-off die attach pad 106. It has been proven in practice that the additional solder wettable surface on the stand-off leads 104 and the stand-off die attach pad 106 may prevent the solder smearing as discussed in the background.

Figure 2:
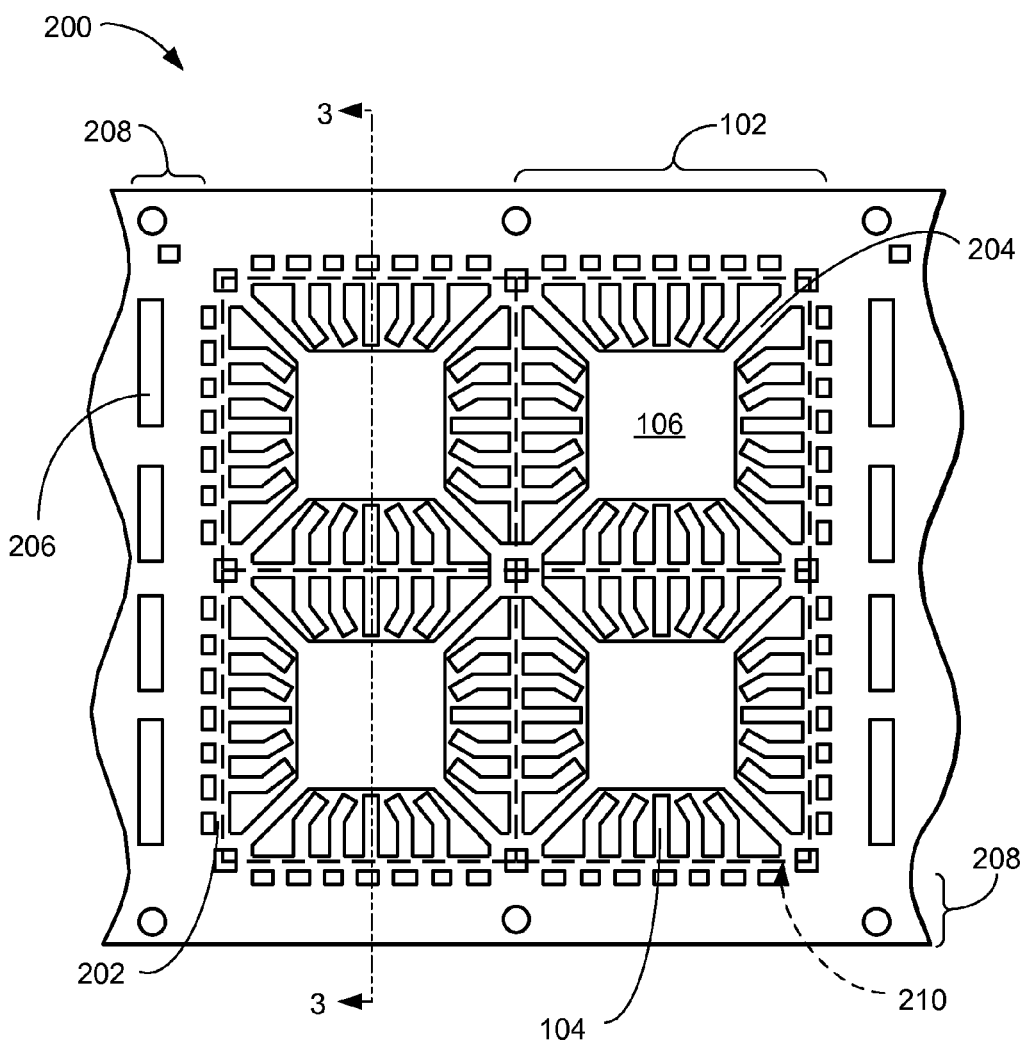
FIG. 2 is a top view of a lead frame strip used in manufacturing the integrated circuit package system of the present invention.

Referring now to FIG. 2, therein is shown a top view of a lead frame strip 200 used in manufacturing the integrated circuit package system 100 of the present invention. The top view of the lead frame strip 200 depicts a group of four of the lead frames 102 arranged in close proximity.

The lead frames 102 are formed using standard lead frame manufacturing processes such as etching and stamping. Other features on the lead frame strip 200 may include lead frame connection bars 202, tie bars 204, alignment slots 206, and peripheral regions 208, that may surround the array of the lead frames 102. A singulation path 210 is shown as a dashed line though it may not be present on the actual implementation of the lead frame strip 200, but is shown for discussion purposes.

The singulation path 210 is drawn along the lead frame connection bars 202 to define the boundary of the lead frame 102. During the singulation process, a singulation saw (not shown) will cut along the singulation path 210 to remove the lead frame connection bars 202. This process removes the material that couples all of the leads together and to the lead frame strip 200.

The lead frames 102 may have the tie bars 204 securing the stand-off die attach pads 106 in a central position to the lead frames 102. It is understood that the number of the lead frames 102 represented in the lead frame strip 200 is for example only and any number of the lead frames 102 may be present. Other features on the lead frame strip 200 may provide registration for moving the lead frame strip 200 or to remove material from the path of the singulation saw in order to extend the useable life of the singulation saw.

Figure 3:
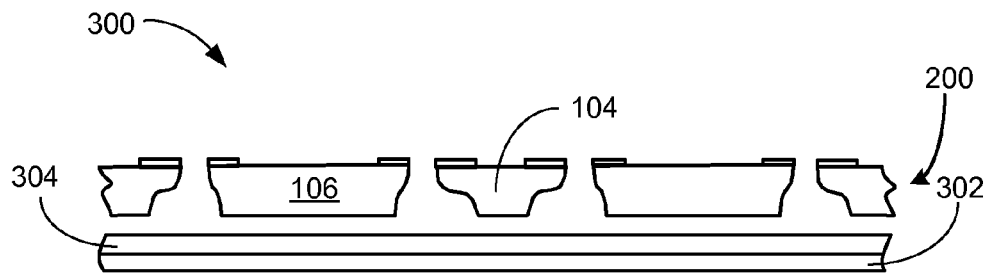
FIG. 3 is a cross-sectional view of a segment of the lead frame strip taken along a line 3-3 of FIG. 2 in a preparation phase of manufacturing.

A section line 3-3 shows the position and direction of view shown in FIG. 3 and is generally the same for other cross-sectional views. The number, position and shape of the stand-off leads 104 is an example only and any different number, position, and shape may be implemented.

Referring now to FIG. 3, therein is shown a cross-sectional view of a segment 300 of the lead frame strip 200 taken along a line 3-3 of FIG. 2 in a preparation phase of manufacturing. The cross-sectional view of the segment 300 of the lead frame strip 200 depicts a coverlay tape 302, with a penetrable layer 304, such as an ultra-violet light releasable adhesive, a heat releasable film, or B-stage curable materials, in a precisely measured thickness.

The coverlay tape 302 is a simplified example of a carrier for the penetrable layer 304 and other carriers are possible. The example of the coverlay tape 302 is not meant to be a limiting element, but rather an easily understood and known example. As another example the penetrable layer 304 may be deposited directly in a mold base (not shown) prior to installing the lead frame for package molding. Other modes of utilizing the penetrable layer 304 will be understood by those skilled in the art once they have read this application.

The segment of the lead frame strip 200 includes the stand-off leads 104 and the stand-off die attach pads 106. It has been discovered that the stand-off leads 104 and the stand-off die attach pads 106 may be pressed through the penetrable layer 304 to have their bottom surfaces attached to the coverlay tape 302. The penetrable layer 304 may adhere to the sides of the stand-off leads 104 and the stand-off die attach pads 106 up to the stand-off height 118, of FIG. 1.

Figure 4:
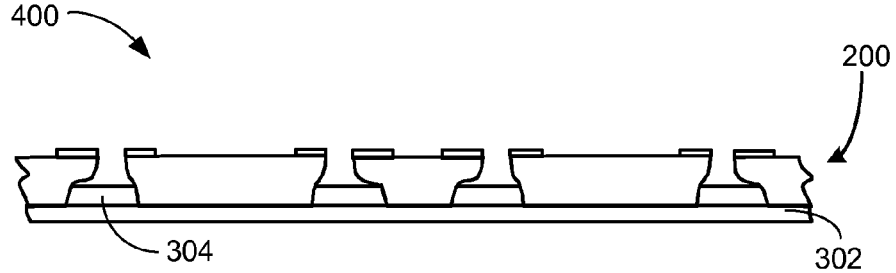
FIG. 4 is a cross-sectional view of a segment of the lead frame strip in a mounted phase of manufacturing.

Referring now to FIG. 4, therein is shown a cross-sectional view of a segment 400 of the lead frame strip 200 in a mounted phase of manufacturing. The cross-sectional view of the segment 400 of the lead frame strip 200 depicts the stand-off leads 104 and the stand-off die attach pads 106 have been pressed through the penetrable layer 304 to have their bottom surfaces attached to the coverlay tape 302.

The penetrable layer 304 may be adhered to the surface of the stand-off leads 104 and the stand-off die attach pads 106. The depth of the penetrable layer 304 may be predetermined to prevent the capillary effect and solder smearing that can impact prior art QFN packages.

It is understood that the lead frame strip 200 is an example only and the present invention is not limited to applications utilizing the lead frame 102, of FIG. 1. The present invention may also be applied to package devices having system interconnects acting as the leads 104, such as solder balls, solder columns, or stud bumps. By partially immersing the system interconnects in the penetrable layer 304, the stand-off height 118, of FIG. 1, may prevent the capillary effect and solder smearing as detailed above. Many package types may benefit from the advantages of the stand-off leads 104 as provided by using the penetrable layer 304, with or without the lead frame 102.

Figure 5:
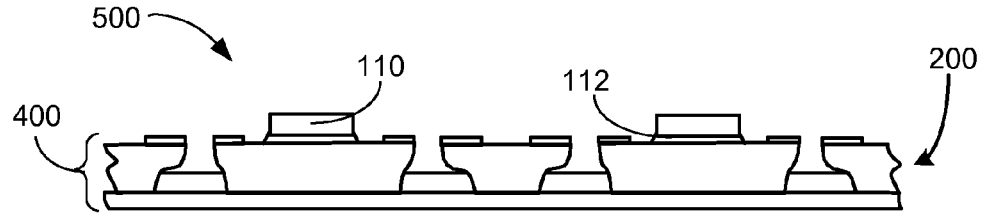
FIG. 5 is a cross-sectional view of a segment of the lead frame strip in a die attach phase of manufacturing.

Referring now to FIG. 5, therein is shown a cross-sectional view of a segment 500 of the lead frame strip 200 in a die attach phase of manufacturing. The cross-sectional view of the segment 500 of the lead frame strip 200 depicts the segment 400 having the integrated circuit dies 110 attached to the stand-off die attach pads 106 by the adhesive 112.

The die attach process used to position and mount the adhesive 112 and the integrated circuit dies 110 is standard and no changes are required to be made to either equipment of process to utilize the present invention.

Figure 6:
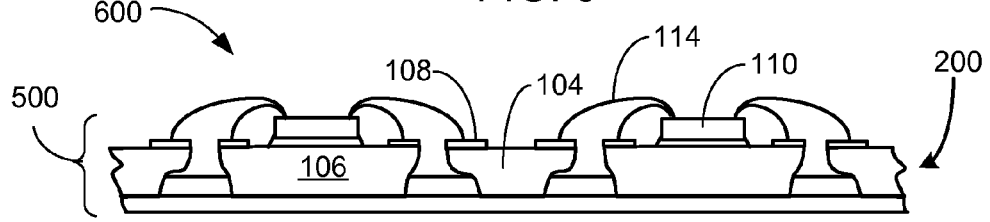
FIG. 6 is a cross-sectional view of a segment of the lead frame strip in a wire bonding phase of manufacturing.

Referring now to FIG. 6, therein is shown a cross-sectional view of a segment 600 of the lead frame strip 200 in a wire bonding phase of manufacturing. The cross-sectional view of the segment 600 of the lead frame strip 200 depicts the segment 500 having the electrical interconnects 114 coupled between the integrated circuit die 110 and the plated pads 108, that may be patterned on the stand-off leads 104 and the stand-off die attach pads 106.

The wire bonding process that couples the electrical interconnects 114 between the integrated circuit die 110 and the plated pads 108 is the standard process and no change is required to utilize the present invention.

Figure 7:
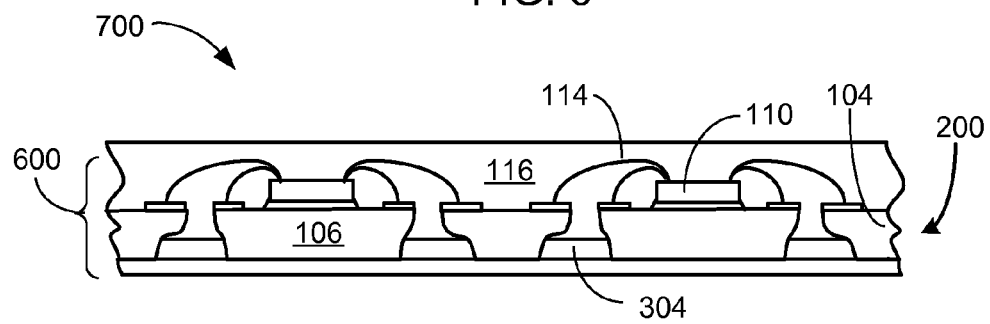
FIG. 7 is a cross-sectional view of a segment of the lead frame strip in a molding phase of manufacturing.

Referring now to FIG. 7, therein is shown a cross-sectional view of a segment 700 of the lead frame strip 200 in a molding phase of manufacturing. The cross-sectional view of the segment 700, of the lead frame strip 200, depicts the segment 600 having the package body 116 formed on the electrical interconnects 114, the integrated circuit dies 110, the stand-off leads 104, the stand-off die attach pads 106, and the penetrable layer 304.

The presence of the penetrable layer 304 prevents the epoxy molding compound of the package body 116 from completely enclosing the stand-off leads 104 and the stand-off die attach pads 106. The present invention establishes the stand-off height 118 and sets the position of the bottom 120 of the package body 116 based on the thickness of the penetrable layer 304. No changes are required to be made to the standard molding process in order to utilize the present invention.

Figure 8:
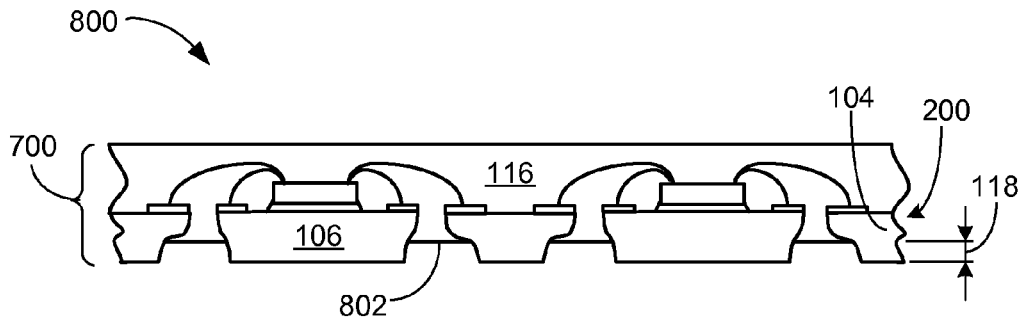
FIG. 8 is a cross-sectional view of a segment of the lead frame strip in a stand-off exposing phase of manufacturing.

Referring now to FIG. 8, therein is shown a cross-sectional view of a segment 800 of the lead frame strip 200 in a stand-off exposing phase of manufacturing. The cross-sectional view of the segment 800, of the lead frame strip 200, depicts the segment 700 with the coverlay tape 302, of FIG. 3, and the penetrable layer 304, of FIG. 3, having been removed.

The removal of the coverlay tape 302 and the penetrable layer 304 may be accomplished by exposing the coverlay tape 302 to ultra-violet light or heat followed by the stripping off of the coverlay tape 302. The penetrable layer 304 may be removed with the coverlay tape 302. A chemical deflash or wash may optionally be used to remove any residual material of the penetrable layer 304 that remains on the surface of the stand-off leads 104 and the stand-off die attach pads 106.

An exposed bottom 802 of the package body 116 is spaced away from the bottom of the stand-off leads 104 and the stand-off die attach pads 106 by the stand-off height 118. This precise measure of the stand-off height 118 may be provided with minimal changes to the manufacturing flow and may eliminate several costly and time consuming etching steps that might otherwise be required.

It has been discovered that by molding the package body 116 on the penetrable layer 304, a precise measure of the stand-off height 118 may be formed. This process may take the place of etching, grinding, or polishing that is known in the prior art. Integrated circuit packages manufactured by the present invention are subjected to less handling and mechanical stress than the prior art packages, which will improve the manufacturing yield and reliability of the finished packages.

Upon close examination of the exposed bottom 802, it will have been characterized by molding the package body 116 on the penetrable layer 304. When the lead frame 102, of FIG. 1, is partially immersed in the penetrable layer 304, a slight meniscus will be formed around the immersed portion of the lead frame 102. The presence of the meniscus will cause a complimentary or mating shape to be present in the molded package body adjacent to each of the elements that were immersed in the penetrable layer 304.

Figure 9:
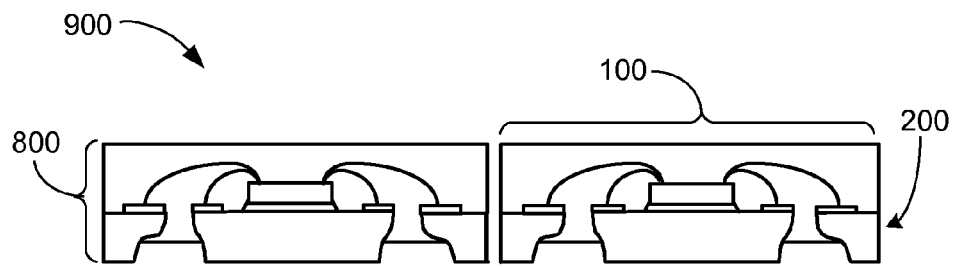
FIG. 9 is a cross-sectional view of a segment of the lead frame strip in a singulation phase of manufacturing.

Referring now to FIG. 9, therein is shown cross-sectional view of a segment 900 of the lead frame strip 200 in a singulation phase of manufacturing. The cross-sectional view of the segment 900 depicts the integrated circuit package system 100, such as a stand-off package, has been singulated from the segment 800 by a cutting or shearing process. The singulation process may utilize a saw (not shown) or a shear (not shown).

Figure 10:
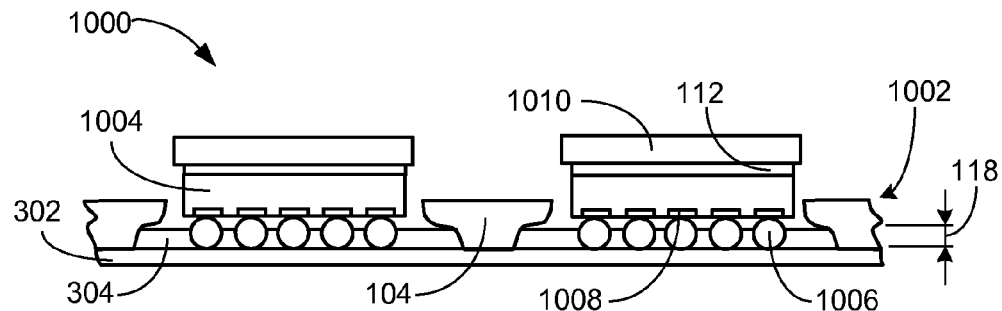
FIG. 10 is a cross-sectional view of a segment of a hybrid lead frame, in a second embodiment of the present invention, in a die attach phase of manufacturing.

Referring now to FIG. 10, therein is shown a cross-sectional view of a segment 1000 of a hybrid lead frame 1002, in a second embodiment of the present invention, in a die attach phase of manufacturing. The cross-sectional view of the segment 1000 depicts the coverlay tape 302 and the penetrable layer 304 having the stand-off leads 104 partially immersed in the penetrable layer 304.

A flip chip die 1004 having system interconnects 1006, such as solder balls, solder columns, or stud bumps, attached to contacts 1008, may be mounted on the coverlay tape 302. The system interconnects 1006 may be partially immersed in the penetrable layer 304.

A second integrated circuit die 1010, such as a wire bond type of integrated circuit die, may be mounted on the inactive side of the flip chip die 1004 by the adhesive 112. No modification of equipment or process flow is required to position the flip chip die 1004 of the second integrated circuit die 1010.

It has been discovered that by partially immersing the system interconnects 1006 of the flip chip die 1004 in the penetrable layer 304, the system interconnects 1006 are less susceptible to collapse and smearing that might occur in standard processes to attach the flip chip die 1004. The combination of the stand-off leads 104 and the system interconnects 1006 that are partially immersed may provide the precise setting of the stand-off height 118.

It is understood that the present invention may be practiced without the hybrid lead frame 1002. By partially immersing the system interconnects 1006 of the flip chip die 1004 in the penetrable layer 304, the stand-off height 118 may be established on the system interconnects 1006 for establishing a more reliable connection to the next level system (not shown).

Figure 11:
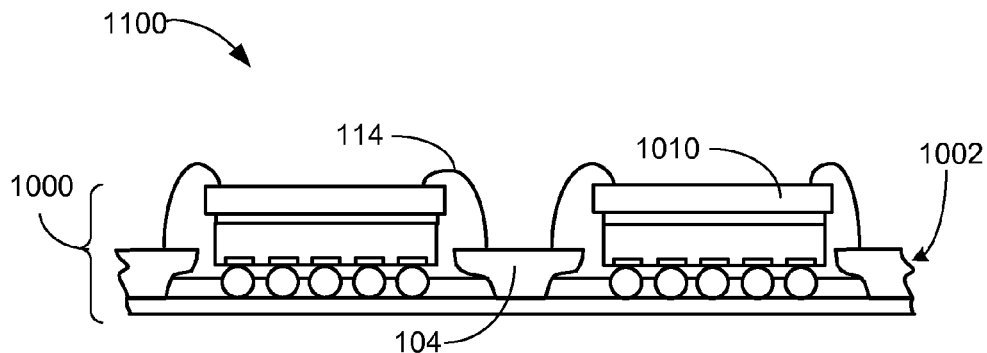
FIG. 11 is a cross-sectional view of a segment of the hybrid lead frame, in the second embodiment of the present invention, in a wire bonding phase of manufacturing.

Referring now to FIG. 11, therein is shown a cross-sectional view of a segment 1100 of the hybrid lead frame 1002, in the second embodiment of the present invention, in a wire bonding phase of manufacturing. The cross-sectional view of the segment 1100 depicts the segment 1000 having the electrical interconnects 114 coupled between the second integrated circuit die 1010 and the stand-off leads 104.

The standard wire bonding process may be used for coupling the second integrated circuit die 1010 and the stand-off leads 104. No change in equipment of process flow is required to perform the wire bonding process just described.

Figure 12:
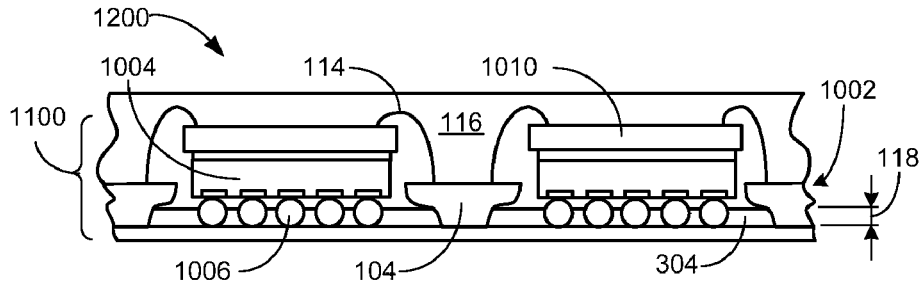
FIG. 12 is a cross-sectional view of a segment of the hybrid lead frame, in the second embodiment of the present invention, in a molding phase of manufacturing.

Referring now to FIG. 12, therein is shown a cross-sectional view of a segment 1200 of the hybrid lead frame 1002, in the second embodiment of the present invention, in a molding phase of manufacturing. The cross-sectional view of the segment 1200 depicts the segment 1100 having the package body 116 formed on the electrical interconnects 114, the second integrated circuit dies 1010, the stand-off leads 104, the flip chip die 1004, the system interconnects 1006, and the penetrable layer 304.

The presence of the penetrable layer 304 prevents the epoxy molding compound of the package body 116 from completely enclosing the stand-off leads 104 and the system interconnects 1006. The present invention establishes the stand-off height 118 and sets the position of the bottom of the package body 116. No changes are required to be made to the standard molding process in order to utilize the present invention.

Figure 13:
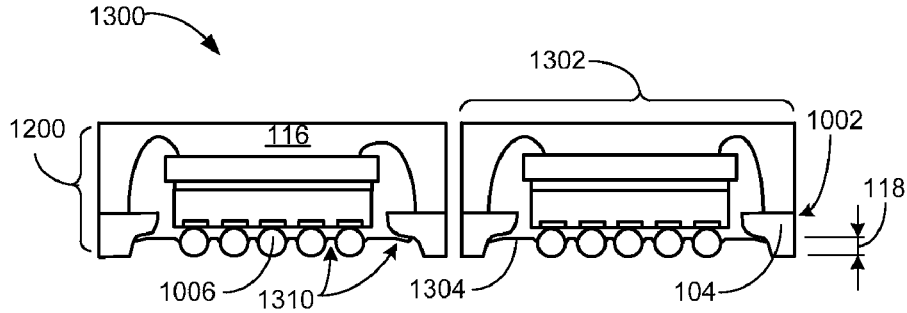
FIG. 13 is a cross-sectional view of a segment of the hybrid lead frame, in the second embodiment of the present invention, in a singulation phase of manufacturing.

Referring now to FIG. 13, therein is shown a cross-sectional view of a segment 1300 of the hybrid lead frame 1002, in the second embodiment of the present invention, in a singulation phase of manufacturing. The cross-sectional view of the segment 1300 depicts a stand-off package 1302 has been singulated from the segment 1200 by a cutting or shearing process. The singulation process may utilize a saw (not shown) or a shear (not shown).

The stand-off package 1302 may have a bottom 1304 of the package body 116 that is spaced away from the bottom of the system interconnects 1006 and the stand-off leads 104 by the stand-off height 118.

Upon close examination of the bottom 1304, there will be evidence of molding the package body 116 on the penetrable layer 304. When the hybrid lead frame 1002, of FIG. 10, is partially immersed in the penetrable layer 304, a slight meniscus will be formed around the immersed portion of the hybrid lead frame 1002 and the system interconnects 1006 of the flip chip die 1004. The presence of the meniscus will cause a complimentary or mating shape to be present in the bottom 1304 of the package body 116 adjacent to each of the elements that were immersed in the penetrable layer 304. The complimentary shape can form meniscus protrusions 1310 extending out of the package body 116 and directly on the system interconnects 106 and directly on the hybrid lead frame 1002 including the stand-off leads 104 of the hybrid lead frame 1002.

Figure 14:
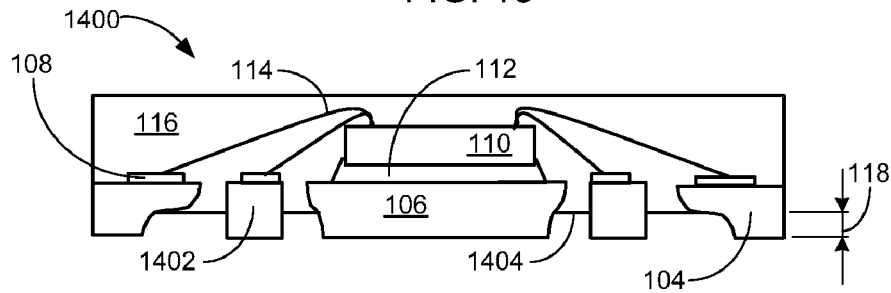
FIG. 14 is a cross-sectional view of an integrated circuit package system with multi-row stand-off leads in a third embodiment of the present invention.

Referring now to FIG. 14, therein is shown a cross-sectional view of an integrated circuit package system 1400 with multi-row stand-off leads in a third embodiment of the present invention. The cross-sectional view of the integrated circuit package system 1400 depicts the stand-off leads 104 and the stand-off die attach pad 106 with second stand-off leads 1402 positioned between them.

The integrated circuit die 110 is attached to the stand-off die attach pad 106 by the adhesive 112. The electrical interconnects 114 may couple the integrated circuit die 110 to the plated pads 108 on the stand-off leads 104 and the second stand-off leads 1402. The package body 116 may be formed on the electrical interconnects 114, the integrated circuit die 110, the stand-off die attach pad 106, the stand-off leads 104 and the second stand-off leads 1402 to provide the stand-off height 118 between a bottom 1404 of the package body 116 and the bottom of the stand-off die attach pad 106, the stand-off leads 104 and the second stand-off leads 1402.

Figure 15:
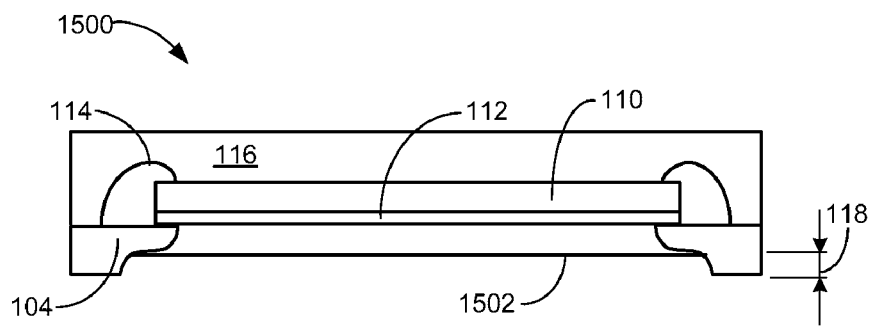
FIG. 15 is a cross-sectional view of an integrated circuit package system with chip-on-leads in a fourth embodiment of the present invention.

Referring now to FIG. 15, therein is shown a cross-sectional view of an integrated circuit package system 1500 with chip-on-leads in a fourth embodiment of the present invention. The cross-sectional view of the integrated circuit package system 1500 depicts the stand-off leads 104 having the integrated circuit die 110 mounted directly to the stand-off leads 104 by the adhesive 112.

The electrical interconnects 114 may couple the integrated circuit die 110 to the stand-off leads 104. The package body 116 is formed on the electrical interconnects 114, the integrated circuit die 110, the adhesive 112, and the stand-off leads 104 for providing the stand-off height 118 between a bottom 1502 of the package body 116 and the bottom of the stand-off leads 104.

Figure 16:
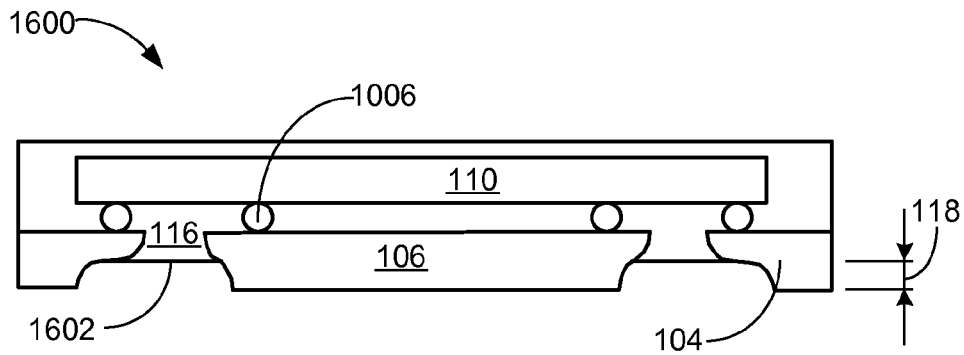
FIG. 16 is a cross-sectional view of an integrated circuit package system with flip chip die in a fifth embodiment of the present invention.

Referring now to FIG. 16, therein is shown a cross-sectional view of an integrated circuit package system 1600 with flip chip die in a fifth embodiment of the present invention. The cross-sectional view of the integrated circuit package system 1600 depicts the stand-off leads 104 and the stand-off die attach pad 106 having the integrated circuit die 110, such as a flip chip die, coupled thereto by the system interconnects 1006.

A bottom 1602 of the package body 116 may be spaced away from the bottom of the stand-off leads 104 and the stand-off die attach pad 106 by the stand-off height 118.

Figure 17:
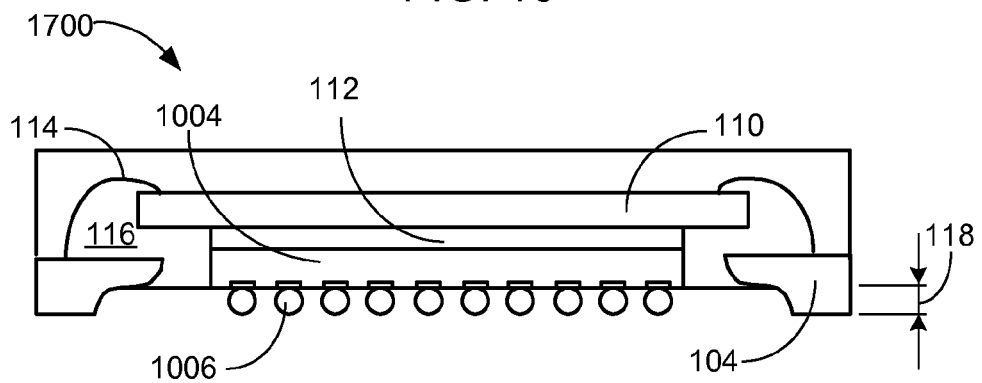
FIG. 17 is a cross-sectional view of an integrated circuit package system in a sixth embodiment of the present invention.

Referring now to FIG. 17, therein is shown a cross-sectional view of an integrated circuit package system 1700 in a sixth embodiment of the present invention. The cross-sectional view of the integrated circuit package system 1700 depicts the stand-off leads 104 having the flip chip die 1004 positioned between them.

The integrated circuit die 110 may be mounted on the inactive side of the flip chip die 1004 by the adhesive 112. The electrical interconnects 114 may couple the integrated circuit die 110 to the stand-off leads 104.

The package body 116 may be formed on the electrical interconnects 114, the integrated circuit die 110, the flip chip die 1004, and the stand-off leads 104 to provide the stand-off height 118. The stand-off height 118 may be adjusted to completely expose the system interconnects 1006 of the flip chip die 1004.

It is understood that the present invention may be practiced without the hybrid lead frame 1002, of FIG. 10. By partially immersing the system interconnects 1006 of the flip chip die 1004 in the penetrable layer 304, the stand-off height 118 may be established on the system interconnects 1006 for providing a more reliable connection to the next level system (not shown).

Figure 18:
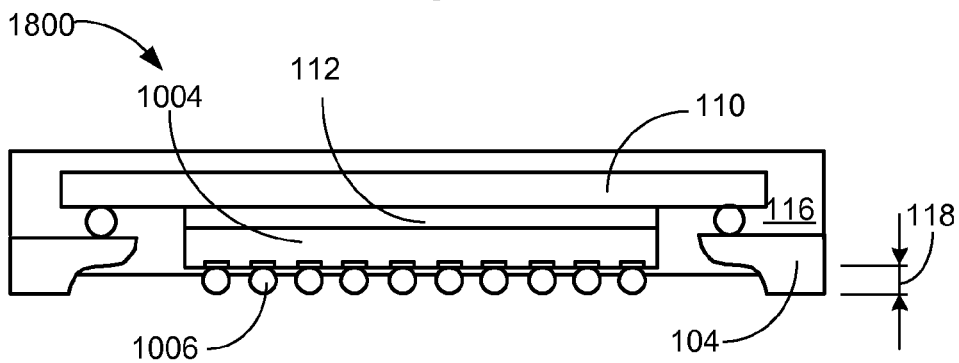
FIG. 18 is a cross-sectional view of an integrated circuit package system in a seventh embodiment of the present invention.

Referring now to FIG. 18, therein is shown a cross-sectional view of an integrated circuit package system 1800 in a seventh embodiment of the present invention. The cross-sectional view of the integrated circuit package system 1800 depicts the stand-off leads 104 having the flip chip die 1004 positioned between them.

The integrated circuit die 110, such as a flip chip die, may be mounted above the inactive side of the flip chip die 1004 by the adhesive 112. The system interconnects 1006 may couple the integrated circuit die 110 to the stand-off leads 104.

The package body 116 may be formed on the system interconnects 1006, the integrated circuit die 110, the flip chip die 1004, and the stand-off leads 104 to provide the stand-off height 118. The stand-off height 118 may be adjusted to partially expose the system interconnects 1006 of the flip chip die 1004.

Figure 19:
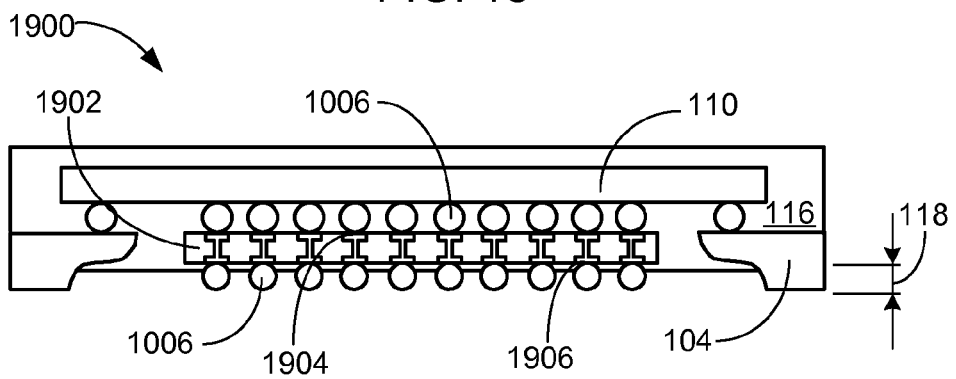
FIG. 19 is a cross-sectional view of an integrated circuit package system in an eighth embodiment of the present invention.

Referring now to FIG. 19, therein is shown a cross-sectional view of an integrated circuit package system 1900 in an eighth embodiment of the present invention. The cross-sectional view of the integrated circuit package system 1900 depicts the stand-off leads 104 having a through silicon via die 1902, having an integrated circuit (not shown), positioned between them.

The integrated circuit die 110, such as a flip chip die, may be mounted on the inactive side of the through silicon via die 1902 by the system interconnects 1006. The system interconnects 1006 may couple the integrated circuit die 110 to the stand-off leads 104 and top side contacts 1904 of the through silicon via die 1902.

The package body 116 may be formed on the system interconnects 1006, the integrated circuit die 110, the through silicon via die 1902, and the stand-off leads 104 to provide the stand-off height 118. The stand-off height 118 may be adjusted to partially expose the system interconnects 1006 that are coupled to bottom side contacts 1906 of the through silicon via die 1902.

Figure 20:
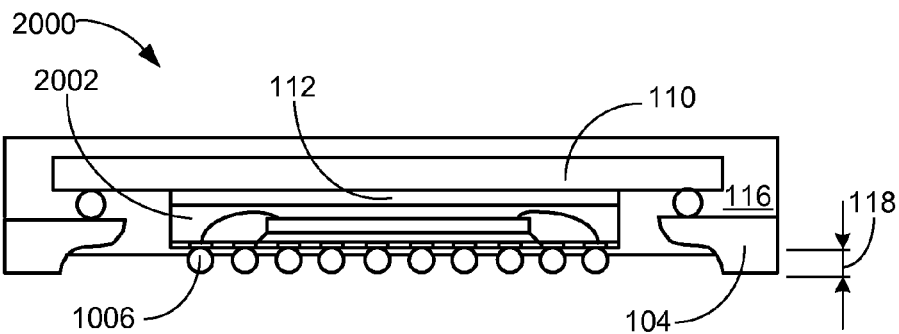
FIG. 20 is a cross-sectional view of an integrated circuit package system in a ninth embodiment of the present invention.

Referring now to FIG. 20, therein is shown a cross-sectional view of an integrated circuit package system 2000 in a ninth embodiment of the present invention. The cross-sectional view of the integrated circuit package system 2000 depicts the stand-off leads 104 having a ball grid array package 2002 positioned between them.

The integrated circuit die 110, such as a flip chip die, may be mounted over the ball grid array package 2002 by the adhesive 112. The system interconnects 1006 may couple the integrated circuit die 110 to the stand-off leads 104.

The package body 116 may be formed on the system interconnects 1006, the integrated circuit die 110, the ball grid array package 2002, and the stand-off leads 104 to provide the stand-off height 118. The stand-off height 118 may be adjusted to partially or fully expose the system interconnects 1006 of the ball grid array package 2002.

It is understood that the present invention may be practiced without the hybrid lead frame 1002, of FIG. 10. By partially immersing the system interconnects 1006 of the ball grid array package 2002 in the penetrable layer 304, the stand-off height 118 may be established on the system interconnects 1006 for providing a more reliable connection to the next level system (not shown).

Figure 21:
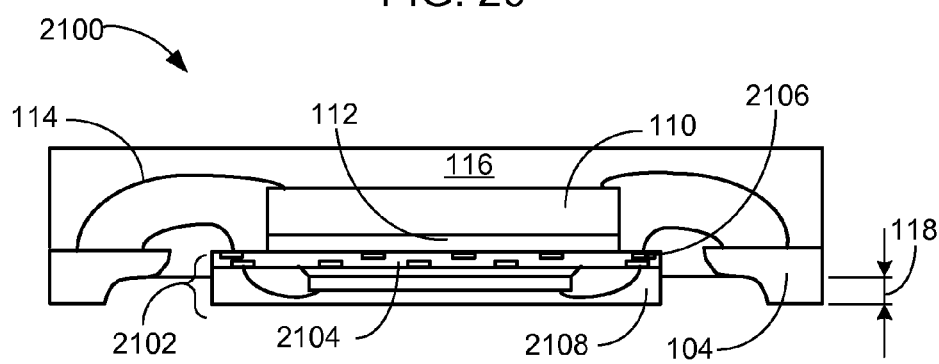
FIG. 21 is a cross-sectional view of an integrated circuit package system with an inverted internal stacking module, in a tenth embodiment of the present invention.

Referring now to FIG. 21, therein is shown a cross-sectional view of an integrated circuit package system 2100 with an inverted internal stacking module 2102, in a tenth embodiment of the present invention. The cross-sectional view of the integrated circuit package system 2100 depicts the stand-off leads 104 having the inverted internal stacking module 2102 positioned between them.

The integrated circuit die 110 may be mounted on the inactive side of a substrate 2104 of the inverted internal stacking module 2102 by the adhesive 112. The electrical interconnects 114 may couple the integrated circuit die 110 and coupling pads 2106 on the substrate 2104 to the stand-off leads 104.

The package body 116 may be formed on the electrical interconnects 114, the integrated circuit die 110, the inverted internal stacking module 2102, and the stand-off leads 104 to provide the stand-off height 118. The stand-off height 118 may be adjusted to partially expose an ISM package body 2108 of the inverted internal stacking module 2102.

Figure 22:
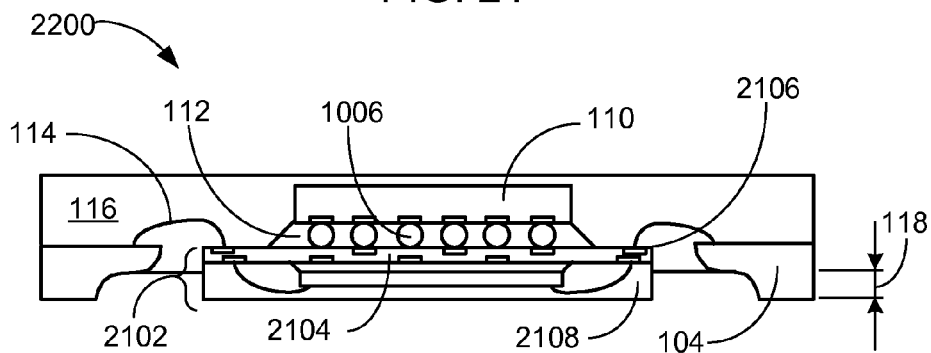
FIG. 22 is a cross-sectional view of an integrated circuit package system with the inverted internal stacking module, in an eleventh embodiment of the present invention.

Referring now to FIG. 22, therein is shown a cross-sectional view of an integrated circuit package system 2200 with the inverted internal stacking module 2102, in an eleventh embodiment of the present invention. The cross-sectional view of the integrated circuit package system 2200 depicts the stand-off leads 104 having the inverted internal stacking module 2102 positioned between them.

The integrated circuit die 110, such as a flip chip die, may be electrically connected to the coupling pads 2106 of the substrate 2104 by the system interconnects 1006. The electrical interconnects 114 may electrically connect the coupling pads 2106 on the substrate 2104 to the stand-off leads 104.

The integrated circuit die 110 may be coupled to the stand-off leads 104 through the substrate 2104 and the electrical interconnects 114. The adhesive 112, such as an underfill material, may be applied between the integrated circuit die 110 and the substrate 2104 of the inverted internal stacking module 2102.

The package body 116 may be formed on the electrical interconnects 114, the integrated circuit die 110, the inverted internal stacking module 2102, and the stand-off leads 104 to provide the stand-off height 118. The stand-off height 118 may be adjusted to partially expose the ISM package body 2108 of the inverted internal stacking module 2102.

Figure 23:
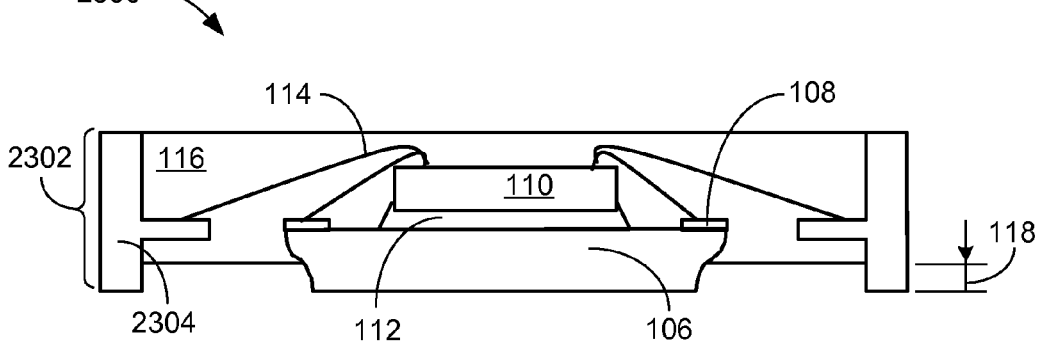
FIG. 23 is a cross-sectional view of an integrated circuit package system with a stacking lead frame, in a twelfth embodiment of the present invention.

Referring now to FIG. 23, therein is shown a cross-sectional view of an integrated circuit package system 2300 with a stacking lead frame 2302, in a twelfth embodiment of the present invention. The cross-sectional view of the integrated circuit package system 2300 depicts the stacking lead frame 2302, such as a copper (Cu) lead frame, having stacking stand-off leads 2304 and the stand-off die attach pad 106.

The plated pad 108, such as a silver pad, or a PPF pad formed by a combination of nickel (Ni), palladium (Pd), and gold (Au), may be selectively plated on the stacking lead frame 2302. The plated pad 108 may provide a compatible coupling region on the surface of the stacking lead frame 2302.

The integrated circuit die 110 may be mounted on the stand-off die attach pad 106 by the adhesive 112, such as a die attach adhesive. The electrical interconnects 114 may couple the integrated circuit die 110 to the stacking stand-off leads 2304, the stand-off die attach pad 106, or a combination thereof.

The package body 116, such as an epoxy molding compound, may be formed on the integrated circuit die 110, the electrical interconnects 114, the plated pad 108, the stacking stand-off leads 2304, and the stand-off die attach pad 106. The package body 116 is formed in a way that provides the stand-off height 118 from the bottom of the stacking stand-off lead 2304 and the stand-off die attach pad 106 to the bottom of the package body 116.

It has been discovered that the forming of the package body 116 to provide the stand-off height 118 may greatly improve the manufacturing assembly yield by eliminating the spread of solder due to the capillary effect.

It was also discovered that the stand-off height 118 provides additional wettable surface on the stacking stand-off leads 2304 and the stand-off die attach pad 106. The additional wettable surface attracts the solder to the stacking stand-off leads 2304 and the stand-off die attach pad 106.

It has further been discovered that the additional wettable surface on the stacking stand-off leads 2304 and the stand-off die attach pad 106 may prevent the solder smearing that is caused by positioning the integrated circuit package system 2300 slightly out of the intended position with the contacts on a printed circuit board (not shown).

The stacking stand-off leads 2304 may provide accessible electrical contacts on the top and bottom of the package body 116. It is understood that the stacking stand-off leads may be utilized in any of the embodiments of the present invention.

Figure 24:
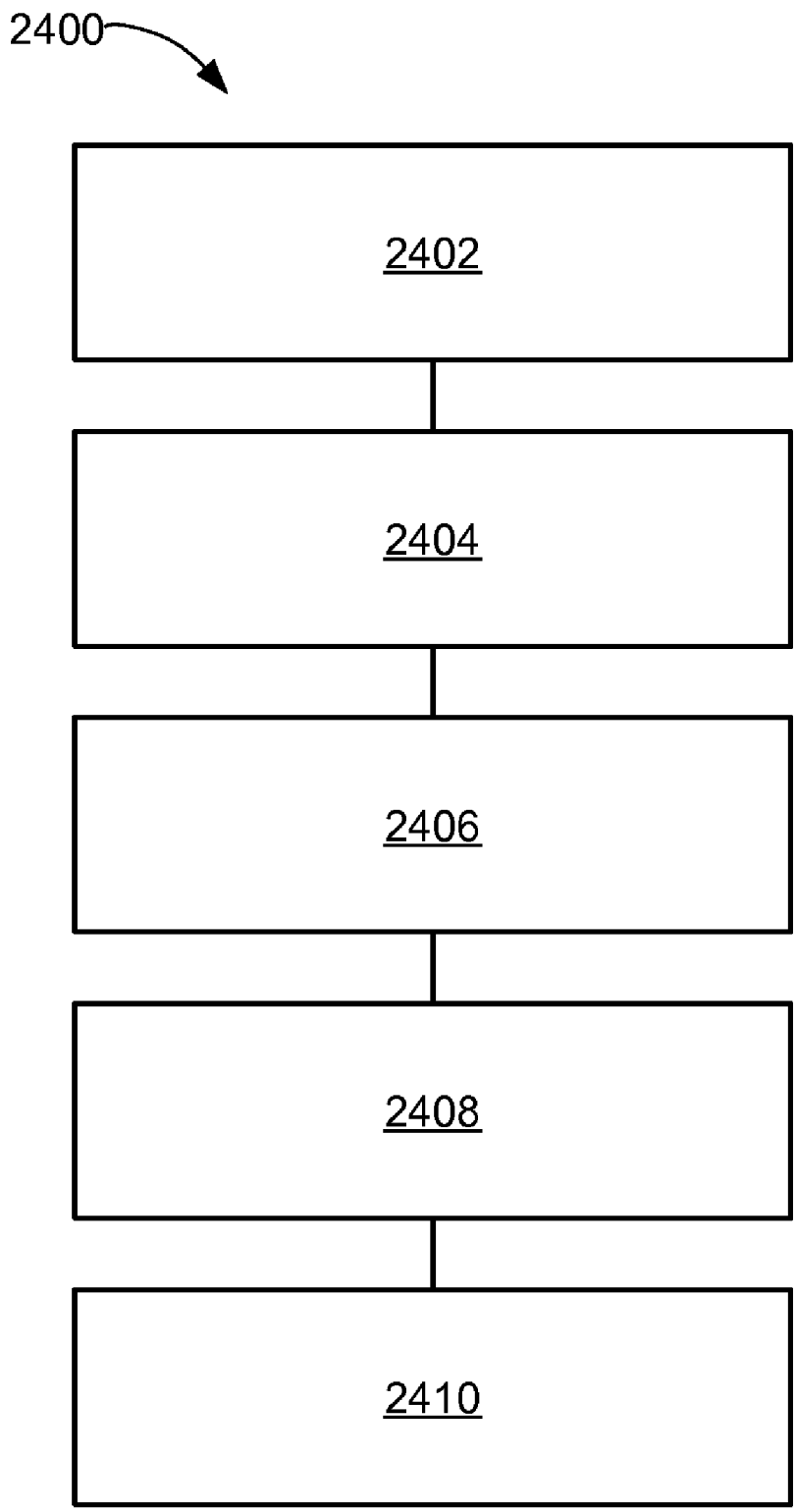
FIG. 24 is a flow chart of a method of manufacture of an integrated circuit package system in a further embodiment of the present invention.

Referring now to FIG. 24, therein is shown a flow chart of a method 2400 of manufacture of an integrated circuit package system in a further embodiment of the present invention. The method 2400 includes: providing a penetrable layer in a block 2402; partially immersing leads in the penetrable layer in a block 2404; coupling an integrated circuit die to the leads in a block 2406; molding a package body on the integrated circuit die, the leads, and the penetrable layer in a block 2408; and exposing stand-off leads from the leads by removing the penetrable layer including establishing a stand-off height between a bottom of the package body and the bottom of the stand-off leads in a block 2410.

The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit package systems, with stand-off leads, fully compatible with conventional manufacturing methods or processes and technologies.

Another important aspect of the present invention is that it valuably supports and services the historical trend of reducing costs, simplifying systems, and increasing performance by eliminating two of the primary causes of assembly related failures in manufacturing assembly of the QFN packaged devices.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit package system comprising:
   providing a penetrable layer;
   partially immersing leads in the penetrable layer;
   coupling an integrated circuit die to the leads;
   molding a package body on the integrated circuit die, the leads, and the penetrable layer; and
   exposing stand-off leads from the leads by removing the penetrable layer including establishing a stand-off height between a bottom of the package body and the bottom of the stand-off leads and the bottom of the package body having a meniscus protrusion extending out of the package body with the meniscus protrusion directly on the stand-off leads.

2. The method as claimed in claim 1 further comprising exposing a stand-off die attach pad surrounded by the leads for supporting the integrated circuit die.

3. The method as claimed in claim 1 further comprising:
   positioning a flip chip die, having system interconnects immersed in the penetrable layer, among the leads; and
   coupling electrical interconnects between the integrated circuit die and the leads.

4. The method as claimed in claim 1 further comprising positioning a ball grid array package among the leads including immersing system interconnects in the penetrable layer.

5. The method as claimed in claim 1 further comprising:
   positioning an inverted internal stacking module among the leads including immersing a stacking package body in the penetrable layer;
   connecting a coupling pad, on the internal stacking module, to the leads; and
   exposing the stacking package body in the stand-off height.

6. A method of manufacture of an integrated circuit package system comprising:
   fabricating a lead frame having leads including forming leads or stacking leads;
   providing a penetrable layer having a precisely measured thickness;
   partially immersing the lead frame including the leads or the stacking leads in the penetrable layer;
   coupling an integrated circuit die to the leads or the stacking leads;
   molding a package body on the integrated circuit die, the lead frame, and the penetrable layer including forming a bottom of the package body by the penetrable layer;
   exposing stand-off leads or stacking stand-off leads from the lead frame by removing the penetrable layer from the leads or stacking leads and the bottom of the package body having a meniscus protrusion extending out of the package body with the meniscus protrusion directly on the stand-off leads; and
   singulating a stand-off package having the stand-off leads or the stacking stand-off leads including a establishing a stand-off height between the bottom of the package body and the bottom of the stand-off leads or stacking stand-off leads.

7. The method as claimed in claim 6 further comprising exposing a stand-off die attach pad in the lead frame for supporting the integrated circuit die including applying an adhesive between the stand-off die attach pad and the integrated circuit die.

8. The method as claimed in claim 6 further comprising:
   positioning a flip chip die, having system interconnects immersed in the penetrable layer, between the leads wherein positioning the flip chip die includes positioning a through silicon via die having an integrated circuit; and
   coupling electrical interconnects between the integrated circuit die and the leads including coupling the system interconnects between the through silicon via die and the integrated circuit die.

9. The method as claimed in claim 6 further comprising positioning a ball grid array package between the leads including immersing system interconnects in the penetrable layer by partially or fully immersing the system interconnects for establishing the stand-off height.

10. The method as claimed in claim 6 further comprising:
    positioning an inverted internal stacking module between the leads including positioning a substrate, of the internal stacking module, under the integrated circuit die and immersing a stacking package body in the penetrable layer;
    connecting a coupling pad, on the internal stacking module, to the leads including the integrated circuit die coupled to the stand-off leads through the substrate; and
    exposing the stacking package body in the stand-off height.

11. An integrated circuit package system comprising:
    stand-off leads positioned along an edge;
    an integrated circuit die coupled to the stand-off leads; and
    a package body molded on the integrated circuit die and the stand-off leads includes a bottom of the package body formed a stand-off height above the bottom of the stand-off leads and the bottom of the package body having a meniscus protrusion extending out of the package body with the meniscus protrusion directly on the stand-off leads.

12. The system as claimed in claim 11 further comprising a stand-off die attach pad positioned between the stand-off leads for supporting the integrated circuit die.

13. The system as claimed in claim 11 further comprising:
    a flip chip die, having system interconnects to protrude from the bottom, between the stand-off leads; and
    electrical interconnects coupled between the integrated circuit die and the stand-off leads.

14. The system as claimed in claim 11 further comprising a ball grid array package between the stand-off leads includes system interconnects to protrude from the bottom of the package body.

15. The system as claimed in claim 11 further comprising:
    an inverted internal stacking module between the stand-off leads;
    a coupling pad, on the internal stacking module, coupled to the stand-off leads; and
    a stacking package body, to protrude from the bottom of the package body, exposed in the stand-off height.

16. The system as claimed in claim 11 wherein stand-off leads positioned includes stacking stand-off leads.

17. The system as claimed in claim 16 further comprising a stand-off die attach pad positioned between the stand-off leads for supporting the integrated circuit die includes an adhesive between the integrated circuit die and the stand-off die attach pad.

18. The system as claimed in claim 16 further comprising:
    a flip chip die, having system interconnects to protrude from the bottom, between the stand-off leads wherein the flip chip die includes a through silicon via die having an integrated circuit; and
    electrical interconnects coupled between the integrated circuit die and the stand-off leads includes the system interconnects coupled from the through silicon via die to the integrated circuit die.

19. The system as claimed in claim 16 further comprising a ball grid array package between the stand-off leads includes system interconnects to protrude from the bottom of the package body including the system interconnects partially or fully protrude for establishing the stand-off height.

20. The system as claimed in claim 16 further comprising:
    an inverted internal stacking module between the stand-off leads includes a substrate, of the internal stacking module, under the integrated circuit die;
    a coupling pad, on the internal stacking module, coupled to the stand-off leads includes the integrated circuit die coupled to the stand-off leads through the substrate; and
    a stacking package body, to protrude from the bottom of the package body, exposed in the stand-off height.

* * * * *